(12) United States Patent
Ceballos et al.

(10) Patent No.: US 12,242,186 B2
(45) Date of Patent: *Mar. 4, 2025

(54) METHODS FOR INCREASING THE DENSITY OF HIGH-INDEX NANOIMPRINT LITHOGRAPHY FILMS

(71) Applicant: Applied Materials, Inc., Santa Clara, CA (US)

(72) Inventors: Andrew Ceballos, Palo Alto, CA (US); Rami Hourani, Santa Clara, CA (US); Kenichi Ohno, Sunnyvale, CA (US); Yuriy Melnik, San Jose, CA (US); Amita Joshi, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/394,133

(22) Filed: Dec. 22, 2023

(65) Prior Publication Data

US 2024/0160099 A1   May 16, 2024

Related U.S. Application Data

(63) Continuation of application No. 17/136,959, filed on Dec. 29, 2020, now Pat. No. 11,892,771.
(Continued)

(51) Int. Cl.
*G03F 7/00* (2006.01)
*B82Y 10/00* (2011.01)
(Continued)

(52) U.S. Cl.
CPC .......... *G03F 7/0002* (2013.01); *C23C 16/045* (2013.01); *C23C 16/45527* (2013.01);
(Continued)

(58) Field of Classification Search
CPC .... G03F 7/0002; G03F 7/0005; G03F 7/2004; C23C 16/045; C23C 16/45527;
(Continued)

(56) References Cited

U.S. PATENT DOCUMENTS 7,547,467 B2   6/2009   Olson et al.
7,691,294 B2   4/2010   Chung et al.
(Continued)

FOREIGN PATENT DOCUMENTS

CN   102760686 A   10/2012
CN   104185878 A   12/2014
(Continued)

OTHER PUBLICATIONS

Japanese Office Action dated Mar. 26, 2024 for Application No. 2022-563140.
(Continued)

*Primary Examiner* — Caleen O Sullivan
(74) *Attorney, Agent, or Firm* — Patterson + Sheridan, LLP (57) ABSTRACT

Embodiments of the present disclosure generally relate to densified nanoimprint films and processes for making these densified nanoimprint films, as well as optical devices containing the densified nanoimprint films. In one or more embodiments, a densified nanoimprint film contains a base nanoimprint film and a metal oxide disposed on the base nanoimprint film and in between the nanoparticles. The base nanoimprint film contains nanoparticles, where the nanoparticles contain titanium oxide, zirconium oxide, niobium oxide, tantalum oxide, hafnium oxide, chromium oxide, indium tin oxide, silicon nitride, or any combination thereof. The metal oxide contains aluminum oxide, titanium oxide, zirconium oxide, niobium oxide, tantalum oxide, indium oxide, indium tin oxide, hafnium oxide, chromium oxide,
(Continued)

scandium oxide, tin oxide, zinc oxide, yttrium oxide, praseodymium oxide, magnesium oxide, silicon oxide, silicon nitride, silicon oxynitride, or any combination thereof.

20 Claims, 3 Drawing Sheets

Related U.S. Application Data (60) Provisional application No. 63/012,691, filed on Apr. 20, 2020, provisional application No. 63/012,688, filed on Apr. 20, 2020.

(51) Int. Cl.
  *C23C 16/04* (2006.01)
  *C23C 16/455* (2006.01)
  *G03F 7/20* (2006.01)
  *H01L 21/28* (2006.01)

(52) U.S. Cl.
  CPC ...... *C23C 16/45553* (2013.01); *G03F 7/0005* (2013.01); *G03F 7/2004* (2013.01); *H01L 21/28123* (2013.01); *B82Y 10/00* (2013.01)

(58) Field of Classification Search
  CPC ............ C23C 16/45553; C23C 16/403; C23C 16/308; C23C 16/345; C23C 16/40; H01L 21/28123; B82Y 10/00; B82Y 40/00
  USPC ........................................................ 430/324
  See application file for complete search history.

(56) References Cited

U.S. PATENT DOCUMENTS

| | | | |
|---|---|---|---|
| 7,745,101 B2 | 6/2010 | Tutt et al. | |
| 7,977,240 B1 | 7/2011 | Rockenberger et al. | |
| 11,133,118 B2 | 9/2021 | Watkins et al. | |
| 11,282,616 B2 | 3/2022 | Watkins et al. | |
| 11,328,833 B2 | 5/2022 | Watkins et al. | |
| 11,892,771 B2* | 2/2024 | Ceballos | H01L 21/28123 |
| 2005/0255237 A1 | 11/2005 | Zhang et al. | |
| 2006/0254502 A1 | 11/2006 | Garrou et al. | |
| 2010/0109201 A1 | 5/2010 | Fletcher et al. | |
| 2011/0056398 A1 | 3/2011 | Weiss et al. | |
| 2011/0064925 A1 | 3/2011 | Van Bommel et al. | |
| 2011/0081538 A1 | 4/2011 | Linton | |
| 2011/0146568 A1 | 6/2011 | Haukka et al. | |
| 2011/0287227 A1 | 11/2011 | Moser | |
| 2014/0072720 A1 | 3/2014 | Watkins et al. | |
| 2015/0140837 A1 | 5/2015 | Chemin et al. | |
| 2015/0283846 A1 | 10/2015 | Trexler et al. | |
| 2015/0291815 A1 | 10/2015 | Verschuuren et al. | |
| 2016/0109799 A1 | 4/2016 | Hernandez et al. | |
| 2018/0305567 A1 | 10/2018 | Verschuuren et al. | |
| 2019/0091950 A1 | 3/2019 | Hernandez Rueda et al. | |
| 2019/0243237 A1 | 8/2019 | Watkins et al. | |
| 2019/0310548 A1 | 10/2019 | Donahue | |
| 2020/0020461 A1 | 1/2020 | Watkins et al. | |
| 2020/0285145 A1 | 9/2020 | Watkins et al. | |
| 2021/0325777 A1* | 10/2021 | Ceballos | G03F 7/0005 |
| 2021/0325778 A1 | 10/2021 | Ceballos et al. | |

FOREIGN PATENT DOCUMENTS

| | | |
|---|---|---|
| CN | 105463402 A | 4/2016 |
| CN | 110651226 A | 1/2020 |
| JP | 2005527110 A | 9/2005 |
| JP | 2011170073 A | 9/2011 |
| JP | 2011221365 A | 11/2011 |
| JP | 2012174735 A | 9/2012 |
| JP | 2015146023 A | 8/2015 |
| JP | 2015158690 A | 9/2015 |
| JP | 2016105203 A | 6/2016 |
| JP | 2019053304 A | 4/2019 |
| JP | 2019123881 A | 7/2019 |
| JP | 2020049656 A | 4/2020 |
| JP | 2020059193 A | 4/2020 |
| JP | 2020132857 A | 8/2020 |
| KR | 101299359 B1 | 8/2013 |
| TW | 200741354 A | 11/2007 |
| TW | 201438906 A | 10/2014 |
| WO | 2018009363 A1 | 1/2018 |
| WO | 2019035579 A1 | 2/2019 |
| WO | 2019067912 A1 | 4/2019 |
| WO | 2019136008 A1 | 7/2019 |

OTHER PUBLICATIONS

Extended European Search Report dated Apr. 25, 2024 for Application No. 21793032.0.
Japanese Office Action dated Mar. 26, 2024 for Application No. 2022-563141.
International Search Report and Written Opinion dated Jun. 10, 2021 for Application No. PCT/US2021/019166.
International Search Report and Written Opinion dated Jun. 15, 2021 for Application No. PCT/US2021/018849.
Taiwan Office Action dated Feb. 10, 2022 for Application No. 110113905.
Chinese Office Action dated Feb. 24, 2022 for Application No. 110113904.
Taiwan Office Action dated Aug. 29, 2022 for Application No. 110113904.
Taiwan Office Action dated Jul. 4, 2023 for Application No. 111129458.
Japanese Office Action dated Oct. 10, 2023 for Application No. 2022-563140.
Japanese Office Action dated Oct. 10, 2023 for Application No. 2022-563141.
Notice of Observation dated Mar. 19, 2024.
Japanese Office Action dated Jul. 30, 2024 for Application No. 2022-563141.
Extended European Search Report dated Sep. 5, 2024 for Application No. 21793030.4.

* cited by examiner

METHODS FOR INCREASING THE DENSITY OF HIGH-INDEX NANOIMPRINT LITHOGRAPHY FILMS

CROSS-REFERENCE TO RELATED APPLICATIONS

This application is a continuation of U.S. application Ser. No. 17/136,959, filed Dec. 29, 2020, which claims benefit to U.S. Prov. Appl. No. 63/012,688, filed on Apr. 20, 2020, and U.S. Prov. Appl. No. 63/012,691, filed on Apr. 20, 2020, which are all herein incorporated by reference.

BACKGROUND

Field

Embodiments of the present disclosure generally relate to micro-device processing, and more specifically to nanoimprint lithography (NIL) films and processes to make the same.

Description of the Related Art

Nano and micro-patterning of nanoparticle imprint provides opportunities for developing nanomaterial-based optics, electronics, displays, energy devices, sensors, and other types of devices with nanometer scale resolution. The imprint materials currently available contain either organic (high index polymers) or inorganic-organic hybrid materials (sol-gel). The majority of the imprint materials have low refractive index (<1.7), along with multiple problems associated with optical transparency in visible region, optical resolution, processability, high shrinkage of imprinted features and cost effectiveness. In addition, many of the imprint materials have relatively low hardness, fracture strain, yield strength, and/or etch resistance, which if increased, would be beneficial. Some imprint materials have relatively high modulus of elasticity, which if decreased, would also be beneficial.

Therefore, improved nanoimprint films with a beneficial physical properties and related processes for making these nanoimprint films are needed.

SUMMARY

Embodiments of the present disclosure generally relate to densified nanoimprint films and related processes for making these densified nanoimprint films. The densified nanoimprint films are typically also optically densified nanoimprint films relative to the base or porous nanoimprint film from which they are formed. The densified nanoimprint films can be useful as nanoimprint lithography (NIL) films. The densified nanoimprint films and/or optically densified nanoimprint films typically have a relatively high refractive index (>1.9 or >2), as well as relatively high hardness, fracture strain, yield strength, and/or etch resistance (e.g., reduced etch rate), and also relatively low modulus of elasticity.

In one or more embodiments, a densified nanoimprint film contains a base nanoimprint film and a metal oxide disposed on the base nanoimprint film and in between the nanoparticles. The base nanoimprint film contains nanoparticles, where the nanoparticles contain titanium oxide, zirconium oxide, niobium oxide, tantalum oxide, hafnium oxide, chromium oxide, indium tin oxide, silicon nitride, or any combination thereof. The metal oxide contains aluminum oxide, titanium oxide, zirconium oxide, niobium oxide, tantalum oxide, indium oxide, indium tin oxide, hafnium oxide, chromium oxide, scandium oxide, tin oxide, zinc oxide, yttrium oxide, praseodymium oxide, magnesium oxide, silicon oxide, silicon nitride, silicon oxynitride, or any combination thereof.

In some embodiments, a method of forming a nanoimprint film includes positioning a substrate containing a porous nanoimprint film within a processing chamber, wherein the porous nanoimprint film comprises nanoparticles and voids between the nanoparticles, and depositing a metal oxide on the porous nanoimprint film and within at least a portion of the voids to produce an densified nanoimprint film during an atomic layer deposition (ALD) process.

In other embodiments, an optical device with gratings containing a densified nanoimprint film is provided and discussed herein. Any of the densified nanoimprint films and/or methods for producing densified nanoimprint films described and discussed herein can be used to produce the optical device. For example, the densified nanoimprint film contains a base nanoimprint film and a metal oxide disposed on the base nanoimprint film and in between the nanoparticles as described and discussed herein.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

In one or more embodiments, a method of forming a nanoimprint film includes positioning a substrate containing a base or porous nanoimprint film within a processing chamber, where the porous nanoimprint film contains nanoparticles and voids between the nanoparticles, and the porous nanoimprint film has a refractive index of less than 2. The voids, such as the spaces disposed between the nanoparticles, can contain ambient air, residual organic materials (e.g., one or more hydrocarbons and/or other organic compounds), particulates, and/or one or more other contaminants which can have a relatively low refractive index, such as from about 1, about 1.2, or about 1.3 to about 1.4 or about 1.5.

The method also includes depositing one or more metal oxides on the porous nanoimprint film and within at least a portion of the voids to produce an optically densified nanoimprint film during an atomic layer deposition (ALD) process. The voids can be at least partially filled, substantially filled, or completely filled. For example, at least 3%, at least 5%, or at least 10% of the volume occupied by the voids is filled with the metal oxide by the ALD process. In other examples, from about 20% to about 90% of the volume occupied by the voids is filled with the metal oxide by the ALD process. In some examples, greater than 90%, such as about 95% to 100%, of the volume occupied by the voids is filled with the metal oxide by the ALD process. The optically densified nanoimprint film has a refractive index greater than the refractive index of the base or porous nanoimprint film.

In one or more embodiments, the refractive index of the optically densified nanoimprint film is greater than the refractive index of the porous nanoimprint film by about 0.5%, about 0.75%, about 1%, about 2%, about 4%, or about 5% to about 6%, about 8%, about 10%, about 12%, about 15%, about 20%, about 25%, about 30%, or more. For example, the refractive index of the optically densified nanoimprint film is about 0.5% to about 30% greater than the refractive index of the porous nanoimprint film. In other examples, the refractive index of the optically densified nanoimprint film is about 0.65% to about 20% greater than the refractive index of the porous nanoimprint film. In other examples, the refractive index of the optically densified nanoimprint film is about 0.75% to about 10% greater than the refractive index of the porous nanoimprint film. In some examples, the refractive index of the optically densified nanoimprint film is about 1% to about 6% greater than the refractive index of the porous nanoimprint film.

The refractive index of the porous nanoimprint film is about 1.50, about 1.65, or about 1.75 to about 1.80, about 1.85, about 1.90, about 1.95, about 197, about 1.99, or less than 2. In one or more examples, the refractive index of the porous nanoimprint film is about 1.5 to about 1.95 or about 1.75 to about 1.95. The refractive index of the optically densified nanoimprint film is greater than the refractive index of the porous nanoimprint film. In some examples, the refractive index of the optically densified nanoimprint film is about 1.8 or greater. For example, the refractive index of the optically densified nanoimprint film is about 1.8 to about 2.2, about 1.85 to about 2.15, or about 1.9 to about 2.1.

Any densified nanoimprint film and/or optically densified nanoimprint film can have an increased mass per unit volume and/or can have an increased refractive index over the porous nanoimprint film and/or the base nanoimprint film, as described and discussed herein. In one or more embodiments, the densified nanoimprint film has a greater value of hardness, a greater value of fracture strain, a greater value of yield strength, and/or a greater value of etch resistance than the porous nanoimprint film or the base nanoimprint film. In some embodiments, the densified nanoimprint film has a lesser value of modulus of elasticity than the porous nanoimprint film or the base nanoimprint film.

In one or more embodiments, the nanoparticles can be or include titanium oxide, zirconium oxide, niobium oxide, tantalum oxide, hafnium oxide, chromium oxide, indium tin oxide, silicon nitride, or any combination thereof. Any nanoparticle described and discussed here can be used be prepare the porous nanoimprint film. The metal oxide can be or include one or more aluminum oxide, titanium oxide, zirconium oxide, niobium oxide, tantalum oxide, indium oxide, indium tin oxide, hafnium oxide, chromium oxide, scandium oxide, tin oxide, zinc oxide, yttrium oxide, praseodymium oxide, magnesium oxide, or any combination thereof. Instead of a metal oxide or along with a metal oxide, one or more silicon oxides and or silicon nitrides can be deposited on and/or in the porous nanoimprint film. Exemplary silicon oxides can be or include silicon monoxide, silicon dioxide, one or more silicon oxide of $SiO_x$ (where $2>x>1$), one or more silicates, silicon nitride, silicon oxynitride, or any combination thereof. The metal oxide can have a refractive index greater than, equal to, or less than the refractive index of the nanoparticles and/or the porous nanoimprint film. Even if the refractive index of the metal oxide is equal to or less than the refractive index of the nanoparticles and/or the porous nanoimprint film, the metal oxide has a greater refractive index than the one or more materials which is being replaced in the voids, such as air, organic compounds, particulates, and/or one or more other contaminants.

Methods for Preparing an Imprinted Surface of the Base or Porous Nanoimprint Film In one or more embodiments, methods for preparing an imprinted surface, such as a nanoimprint lithography (NIL) film, are provided. The imprinted surface is one or more exposed surfaces of the base or porous nanoimprint film described and discussed herein. The method includes disposing, coating, or otherwise placing an imprint composition on one or more substrates, contacting the imprint composition with a stamp having a pattern, converting the imprint composition to an imprint material (e.g., a porous nanoimprint film), and removing the stamp from the imprint material. In some examples, the substrate (e.g., wafer) can be or include glass, quartz, silicon oxide, such as a glass substrate or a glass wafer. In other examples, the substrate can be or include silicon, silicon-germanium, plastic, and/or other materials. The imprint composition and/or material can have a refractive index of about 1.7 to about 2.0, or about 1.7 to less than 2, such as about 1.9, 1.85, or 1.80. The pattern on the stamp and transferred to the imprinted surface can be a 1-dimension pattern, a 2-dimension pattern, or a 3-dimension pattern.

Figure 1A:
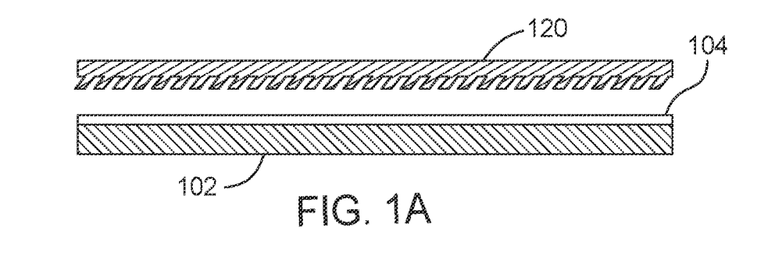
FIGS. 1A-1F depict cross-sectional views of a workpiece being processed through multiple operations while preparing a nanoimprint film containing nanoparticles, according to one or more embodiments described and discussed herein.
Figure 1B:
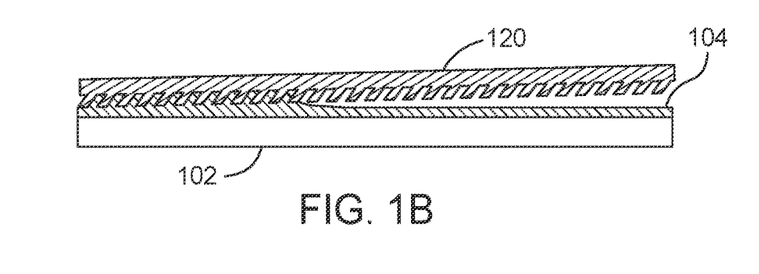
Figure 1C:
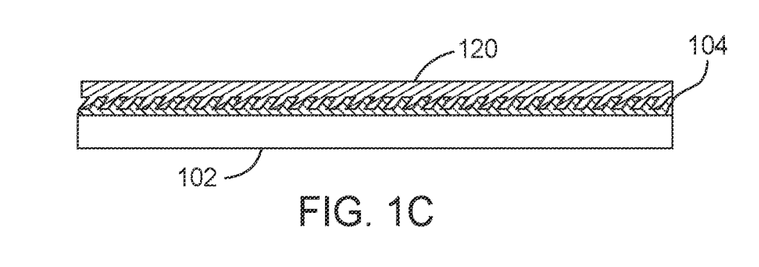
Figure 1D:
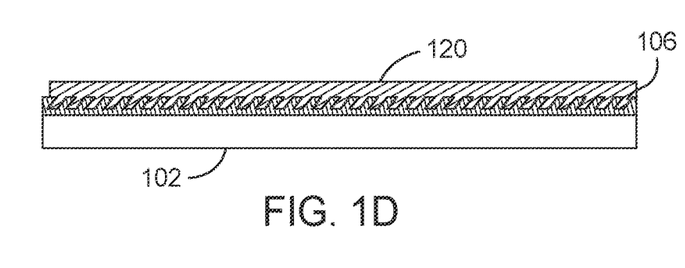
Figure 1E:
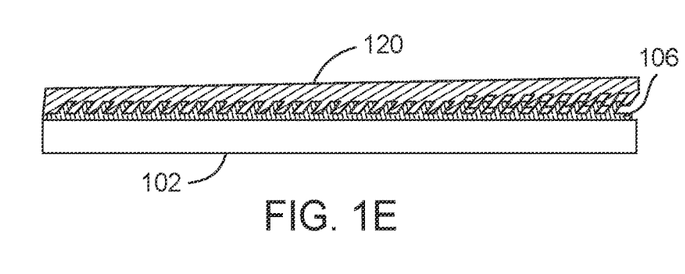
Figure 1F:
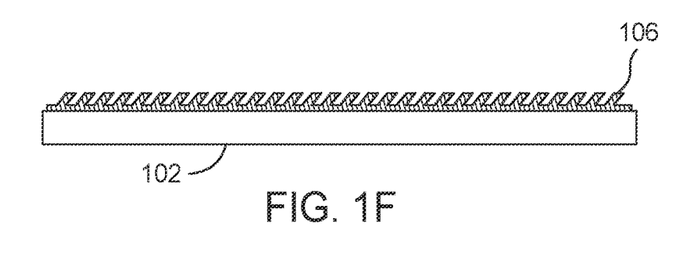

FIGS. 1A-1F depict cross-sectional views of a workpiece being processed through multiple operations while preparing a nanoimprint film containing nanoparticles, such as the base or porous nanoimprint film, according to one or more embodiments described and discussed herein. The porous nanoimprint film is formed on the substrate by an imprint process. The imprint process includes disposing an imprint composition 104 containing nanoparticles on a substrate 102 and aligning a stamp 120 above or adjacent to the imprint composition 104 (FIG. 1A). The imprint composition 104 is impressed or otherwise contacted with the stamp 120 having a pattern (FIGS. 1B-1C). The imprint composition 104 is converted to a porous nanoimprint film 106 (FIG. 1D). In some examples, a curing process with heat and/or radiation (UV light) is used to convert the imprint composition 104 to the porous nanoimprint film 106. The stamp 120 is removed from the porous nanoimprint film 106, which is left disposed on the substrate 102 (FIGS. 1E-1F). The pores of the porous nanoimprint film 106 may have some residual organic material, such as a minimal organic matrix that exists because of imperfect packing of nanoparticles.

In some examples, the imprint composition is disposed on the substrate by spin coating, drop casting, blade coating, and/or other coating processes. The imprint composition is disposed on the substrate as a film or a layer having a predetermined thickness. The thickness of the imprint composition is about 50 nm, about 80 nm, about 100 nm, about 120 nm, about 150 nm, or about 200 nm to about 250 nm, about 300 nm, about 400 nm, about 500 nm, about 600 nm, about 800 nm, about 1,000 nm, about 1,200 nm, or thicker. For example, the thickness of the imprint composition is about 50 nm to about 1,000 nm, about 100 nm to about 1,000 nm, about 200 nm to about 1,000 nm, about 400 nm to about 1,000 nm, about 500 nm to about 1,000 nm, about 600 nm to about 1,000 nm, about 800 nm to about 1,000 nm, about 50 nm to about 600 nm, about 100 nm to about 600 nm, about 200 nm to about 600 nm, about 400 nm to about 600 nm, about 500 nm to about 600 nm, about 50 nm to about 400 nm, about 100 nm to about 400 nm, about 200 nm to about 400 nm, or about 300 nm to about 400 nm.

The imprint composition is converted to the imprint material (e.g., the porous nanoimprint film) by exposing the imprint composition to heat, ultraviolet light, infrared light, visible light, microwave radiation, and/or any combination thereof. In one or more examples, when converting the imprint composition to the imprint material, the imprint composition is exposed to a light source having a wavelength of about 300 nm to about 365 nm. In other examples, when converting the imprint composition to the imprint material, the imprint composition is exposed to heat and maintained at a temperature of about 30° C. to about 100° C. for a time period of about 30 seconds to about 1 hour. In some examples, the imprint composition is exposed to heat and maintained at a temperature of about 50° C. to about 60° C. for a time period of about 1 minute to about 15 minutes.

ALD of Metal Oxide to Prepare Optically Densified Nanoimprint Film

In one or more embodiments, one or more metal oxides are deposited or otherwise formed by ALD or another vapor deposition process on and within the base or porous nanoimprint film. Voids, or portions of voids, within the porous nanoimprint film are at least partially filled with the metal oxide to produce the optically densified nanoimprint film. As discussed above, the voids can be at least partially filled, substantially filled, or completely filled by the metal oxide during the ALD process.

Figure 2A:
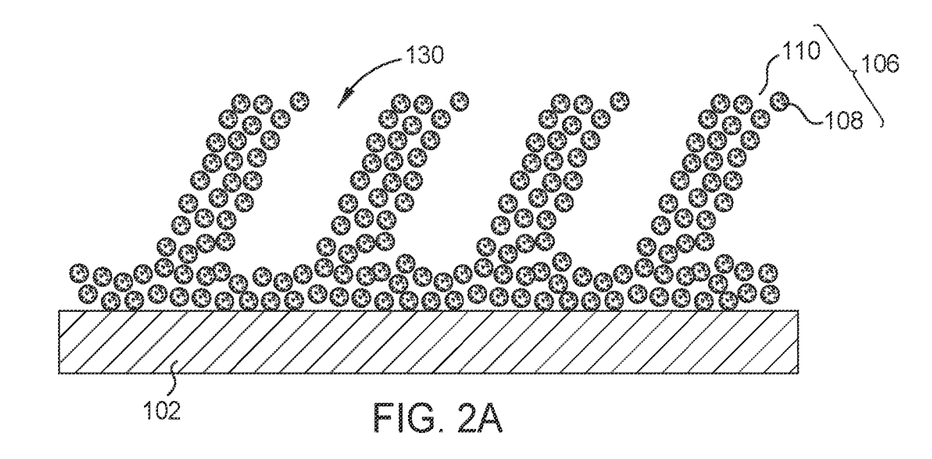
FIGS. 2A-2B depict cross-sectional views of a workpiece being processed to prepare an optically densified nanoimprint film, according to one or more embodiments described and discussed herein.
Figure 2B:
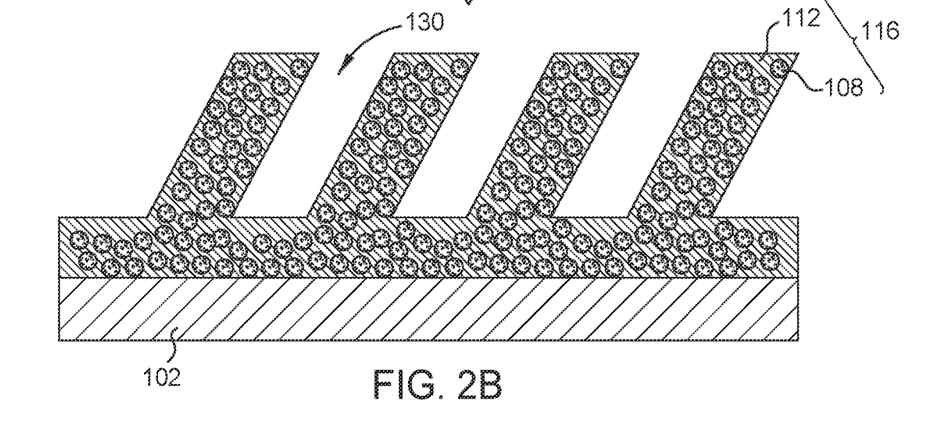

FIGS. 2A-2B depict cross-sectional views of a workpiece being processed to convert a porous nanoimprint film to be an optically densified nanoimprint film, according to one or more embodiments described and discussed herein. The porous nanoimprint film 106 containing features 130 is left disposed on the substrate 102, as depicted in FIG. 2A. The porous nanoimprint film 106 contains a plurality of nanoparticles 108 separated by a plurality of spaces or voids 110. An ALD process or another vapor deposition process is used to deposit metal oxide 112 between the nanoparticles 108 and into the voids 110 to produce the optically densified nanoimprint film 116, as depicted in FIG. 2B. The features 130 formed in the porous nanoimprint film 106 are at least substantially, if not completely, preserved in the optically densified nanoimprint film 116.

The ALD process includes sequentially exposing the porous nanoimprint film to a metal precursor and an oxidizing agent (and or other reagent) during an ALD cycle to deposit the metal oxide. The ALD cycle also includes exposures of purge gas between each exposure of the precursors. For example, the ALD process includes sequentially exposing the porous nanoimprint film to a metal precursor, a purge gas, an oxidizing agent (and or other reagent), and the purge gas during the ALD cycle. The purge gas can be or include nitrogen ($N_2$), argon, helium, or any combination thereof.

In some instances, the ALD cycle can be performed a single time to deposit the metal oxide while producing the optically densified nanoimprint film. In other examples, the ALD cycle can be performed two or more times to deposit the metal oxide while producing the optically densified nanoimprint film. For example, the ALD cycle can be repeated from 2, 3, 4, 5, 6, 7, 8, 9, 10, 12, or 15 times to about 18, about 20, about 25, about 30, about 40, about 50, about 60, about 80, about 100, or more times to deposit the metal oxide while producing the optically densified nanoimprint film.

In one or more examples, if the metal oxide is or contains aluminum oxide, then the metal precursor is one or more aluminum precursors, such as an alkyl aluminum compound, for example, trimethylaluminum, triethylaluminum, tripropylaluminum, tributylaluminum, or the like. The oxidizing agent can be or include water, oxygen ($O_2$), ozone, atomic oxygen, nitrous oxide, hydrogen peroxide, one or more organic peroxides, plasma thereof, or any combination thereof.

In one or more embodiments, an optically densified nanoimprint film contains a base nanoimprint film containing nanoparticles and optionally voids between the nanoparticles, and where the base nanoimprint film has a refractive index of less than 2. The optically densified nanoimprint film also contains a metal oxide disposed on the base nanoimprint film and contained within at least a portion of the voids. The optically densified nanoimprint film has a refractive index greater than the refractive index of the base nanoimprint film.

Imprint Compositions for Preparing NIL Films

Embodiments of the present disclosure generally relate to imprint compositions and imprint materials (e.g., base or porous nanoimprint films) useful for nanoimprint lithography (NIL). The imprint composition can be converted to the imprint material by applying heat and/or one or types of radiation, such as light or microwave. In one or more embodiments, the imprint composition contains one or more types of nanoparticles, one or more surface ligands, one or more solvents, one or more additives, and one or more acrylates.

Each of the nanoparticles can be a single particle (bare particle) or can be a coated particle, such as containing a core and one or more shells disposed around the core. In some examples, the nanoparticles can contain one or more types of surface ligands coupled to the outer surface of the particle (e.g., ligated NPs or stabilized NPs). The nanoparticles can have one or more different shapes or geometries, such as spherical, oval, rod, cubical, wire, cylindrical, rectangular, or combinations thereof.

The nanoparticle or the core can have a size or a diameter of about 2 nm, about 5 nm, about 8 nm, about 10 nm, about 12 nm, about 15 nm, about 20 nm, about 25 nm, about 30 nm, or about 35 nm to about 40 nm, about 50 nm, about 60 nm, about 80 nm, about 100 nm, about 150 nm, about 200 nm, about 250 nm, about 300 nm, about 400 nm, about 500 nm, or larger. For example, the nanoparticle or the core can have a size or a diameter of about 2 nm to about 500 nm, about 2 nm to about 300 nm, about 2 nm to about 200 nm, about 2 nm to about 150 nm, about 2 nm to about 100 nm, about 2 nm to about 80 nm, about 2 nm to about 60 nm, about 2 nm to about 50 nm, about 2 nm to about 40 nm, about 2 nm to about 30 nm, about 2 nm to about 20 nm, about 2 nm to about 15 nm, about 2 nm to about 10 nm, about 10 nm to about 500 nm, about 10 nm to about 300 nm, about 10 nm to about 200 nm, about 10 nm to about 150 nm, about 10 nm to about 100 nm, about 10 nm to about 80 nm, about 10 nm to about 60 nm, about 10 nm to about 50 nm, about 10 nm to about 40 nm, about 10 nm to about 30 nm, about 10 nm to about 20 nm, about 10 nm to about 15 nm, about 50 nm to about 500 nm, about 50 nm to about 300 nm, about 50 nm to about 200 nm, about 50 nm to about 150 nm, about 50 nm to about 100 nm, about 50 nm to about 80 nm, or about 50 nm to about 60 nm.

The nanoparticle can be or contain one or more metal oxides, one or more non-metal oxides, one or more non-metal nitrides, and/or diamond materials. The nanoparticle can contain titanium oxide, zirconium oxide, niobium oxide, tantalum oxide, hafnium oxide, chromium oxide, indium tin oxide, silicon nitride, diamond, or any combination thereof. In some embodiments, if the nanoparticle one or more shells disposed around the core, the core and shell can be the same material or different materials. In one or more examples, the core contains titanium oxide and the shell contains silicon oxide, zirconium oxide, niobium oxide, or any combination thereof. In other examples, the core contains niobium oxide and the shell contains silicon oxide, zirconium oxide, or any combination thereof. In some examples, the core contains zirconium oxide and the shell contains silicon oxide.

In some examples, the core has a diameter of about 2 nm to about 500 nm and the shell has a thickness of about 0.1 nm to about 100 nm. In other examples, the core has a diameter of about 5 nm to about 200 nm and the shell has a thickness of about 0.5 nm to about 60 nm. In some examples, the core has a diameter of about 10 nm to about 100 nm and the shell has a thickness of about 1 nm to about 15 nm.

In one or more embodiments, the imprint composition contains about 0.1 wt %, about 0.5 wt %, about 1 wt %, about 2 wt %, about 3 wt %, about 5 wt %, about 6 wt %, about 8 wt %, or about 10 wt % to about 12 wt %, about 15 wt %, about 18 wt %, about 20 wt %, about 22 wt %, about 24 wt %, about 25 wt %, about 28 wt %, about 30 wt %, about 32 wt %, about 35 wt %, about 38 wt %, or about 40 wt % of the nanoparticles. For example, the imprint composition contains about 0.1 wt % to about 40 wt %, about 0.5 wt % to about 40 wt %, about 0.5 wt % to about 35 wt %, about 0.5 wt % to about 32 wt %, about 0.5 wt % to about 30 wt %, about 0.5 wt % to about 28 wt %, about 0.5 wt % to about 25 wt %, about 0.5 wt % to about 22 wt %, about 0.5 wt % to about 20 wt %, about 0.5 wt % to about 18 wt %, about 0.5 wt % to about 15 wt %, about 0.5 wt % to about 12 wt %, about 0.5 wt % to about 10 wt %, about 0.5 wt % to about 8 wt %, about 0.5 wt % to about 6 wt %, about 0.5 wt % to about 5 wt %, about 0.5 wt % to about 4 wt %, about 0.5 wt % to about 3 wt %, about 0.5 wt % to about 2 wt %, about 0.5 wt % to about 1.5 wt %, about 0.5 wt % to about 1 wt %, about 2 wt % to about 40 wt %, about 2 wt % to about 35 wt %, about 2 wt % to about 32 wt %, about 2 wt % to about 30 wt %, about 2 wt % to about 28 wt %, about 2 wt % to about 25 wt %, about 2 wt % to about 22 wt %, about 2 wt % to about 20 wt %, about 2 wt % to about 18 wt %, about 2 wt % to about 15 wt %, about 2 wt % to about 12 wt %, about 2 wt % to about 10 wt %, about 2 wt % to about 8 wt %, about 2 wt % to about 6 wt %, about 2 wt % to about 5 wt %, about 2 wt % to about 4 wt %, about 2 wt % to about 3 wt %, about 5 wt % to about 40 wt %, about 5 wt % to about 35 wt %, about 5 wt % to about 32 wt %, about 5 wt % to about 30 wt %, about 5 wt % to about 28 wt %, about 5 wt % to about 25 wt %, about 5 wt % to about 22 wt %, about 5 wt % to about 20 wt %, about 5 wt % to about 18 wt %, about 5 wt % to about 15 wt %, about 5 wt % to about 12 wt %, about 5 wt % to about 10 wt %, about 5 wt % to about 8 wt %, or about 5 wt % to about 6 wt % of the nanoparticles.

In other embodiments, the imprint composition contains about 40 wt %, about 50 wt %, about 55 wt %, about 60 wt %, about 62 wt %, or about 65 wt % to about 68 wt %, about 70 wt %, about 75 wt %, about 80 wt %, about 85 wt %, about 88 wt %, about 90 wt %, about 92 wt %, about 93 wt %, about 94 wt %, about 95 wt %, about 96 wt %, about 97 wt %, about 98 wt %, or more of the nanoparticles. For example, the imprint composition contains about 40 wt % to about 98 wt %, about 50 wt % to about 95 wt %, about 50 wt % to about 90 wt %, about 50 wt % to about 80 wt %, about 50 wt % to about 75 wt %, about 50 wt % to about 70 wt %, about 50 wt % to about 65 wt %, about 50 wt % to about 60 wt %, about 50 wt % to about 55 wt %, about 60 wt % to about 95 wt %, about 60 wt % to about 90 wt %, about 60 wt % to about 80 wt %, about 60 wt % to about 75 wt %, about 60 wt % to about 70 wt %, about 60 wt % to about 65 wt %, about 70 wt % to about 95 wt %, about 70 wt % to about 90 wt %, about 70 wt % to about 80 wt %, or about 70 wt % to about 75 wt % of the nanoparticles.

The surface ligand can be or include one or more carboxylic acids, one or more esters, one or more amines, one or more alcohols, one or more silanes, salts thereof, complexes thereof, or any combination thereof. Exemplary surface ligands can be or include oleic acid, stearic acid, propionic acid, benzoic acid, palmitic acid, myristic acid, methylamine, oleylamine, butylamine, benzyl alcohol, oleyl alcohol, butanol, octanol, dodecanol, octeyltriethoxy silane, octeyltrimethoxy silane, 3-(trimethoxysilyl)propyl methacrylate, propyltriethoxy silane, salts thereof, esters thereof, complexes thereof, or any combination thereof. In some example, the surface ligand is at a concentration of about 8 wt % to about 50 wt %, based on the weight of the nanoparticles.

The imprint composition contains about 0.5 wt %, about 1 wt %, about 2 wt %, about 3 wt %, about 5 wt %, about 7 wt %, about 8 wt %, or about 10 wt % to about 12 wt %, about 15 wt %, about 18 wt %, about 20 wt %, about 25 wt %, about 30 wt %, about 35 wt %, about 40 wt %, about 45 wt %, or about 50 wt % of the surface ligand. For example, the imprint composition contains about 0.5 wt % to about 50 wt %, about 1 wt % to about 50 wt %, about 3 wt % to about 50 wt %, about 5 wt % to about 50 wt %, about 5 wt % to about 40 wt %, about 5 wt % to about 35 wt %, about 5 wt % to about 30 wt %, about 5 wt % to about 25 wt %, about 5 wt % to about 20 wt %, about 5 wt % to about 15 wt %, about 5 wt % to about 10 wt %, about 10 wt % to about 50 wt %, about 10 wt % to about 40 wt %, about 10 wt % to about 35 wt %, about 10 wt % to about 30 wt %, about 10 wt % to about 25 wt %, about 10 wt % to about 20 wt %, about 10 wt % to about 15 wt %, about 15 wt % to about 50 wt %, about 15 wt % to about 40 wt %, about 15 wt % to about 35 wt %, about 15 wt % to about 30 wt %, about 15 wt % to about 25 wt %, or about 15 wt % to about 20 wt % of the surface ligand.

The solvent can be or include one or more nanoparticle dispersion solvents, one or more imprinting solvents, other types of solvents, or any combination thereof. The nanoparticle dispersion solvent can be or include one or more glycol ethers, alcohols, acetates, esters thereof, salts thereof, derivatives thereof, or any combination thereof. In some examples, the nanoparticle dispersion solvent can be or include one or more p-series glycol ethers, one or more e-series glycol ethers, or any combination thereof. In one or more examples, the nanoparticle dispersion solvent contains propylene glycol methyl ether acetate (PGMEA). The imprinting solvent can be or include one or more alcohols, one or more esters, salts thereof, or any combination thereof. In one or more examples, the imprinting solvent contains ethyl lactate.

In one or more embodiments, the imprint composition contains about 50 wt %, about 55 wt %, about 60 wt %, about 62 wt %, about 65 wt %, about 68 wt %, about 70 wt %, about 72 wt %, about 75 wt %, or about 80 wt % to about 83 wt %, about 85 wt %, about 87 wt %, about 88 wt %, about 90 wt %, about 92 wt %, about 94 wt %, about 95 wt %, about 97 wt %, or about 98 wt % of one or more solvents. For example, the imprint composition contains about 50 wt % to about 98 wt %, about 60 wt % to about 98 wt %, about 60 wt % to about 95 wt %, about 60 wt % to about 90 wt %, about 60 wt % to about 88 wt %, about 60 wt % to about 85 wt %, about 60 wt % to about 83 wt %, about 60 wt % to about 80 wt %, about 60 wt % to about 78 wt %, about 60 wt % to about 75 wt %, about 60 wt % to about 72 wt %, about 60 wt % to about 70 wt %, about 60 wt % to about 68 wt %, about 60 wt % to about 65 wt %, about 60 wt % to about 63 wt %, about 70 wt % to about 98 wt %, about 70 wt % to about 95 wt %, about 70 wt % to about 90 wt %, about 70 wt % to about 88 wt %, about 70 wt % to about 85 wt %, about 70 wt % to about 83 wt %, about 70 wt % to about 80 wt %, about 70 wt % to about 78 wt %, about 70 wt % to about 75 wt %, about 70 wt % to about 72 wt %, about 80 wt % to about 98 wt %, about 80 wt % to about 95 wt %, about 80 wt % to about 90 wt %, about 80 wt % to about 88 wt %, about 80 wt % to about 85 wt %, about 80 wt % to about 83 wt %, or about 80 wt % to about 82 wt % of one or more solvents.

In some embodiments, the imprint composition contains about 0.5 wt %, about 0.8 wt %, about 1 wt %, about 1.5 wt %, about 2 wt %, about 2.5 wt %, about 3 wt %, about 3.5 wt %, about 4 wt %, about 5 wt %, or about 6 wt % to about 7 wt %, about 8 wt %, about 10 wt %, about 12 wt %, about 14 wt %, about 15 wt %, about 18 wt %, about 20 wt %, or about 25 wt % of the nanoparticle dispersion solvent. For example, the imprint composition contains about 0.5 wt % to about 20 wt %, about 1 wt % to about 20 wt %, about 1 wt % to about 18 wt %, about 1 wt % to about 15 wt %, about 1 wt % to about 13 wt %, about 1 wt % to about 12 wt %, about 1 wt % to about 11 wt %, about 1 wt % to about 10 wt %, about 1 wt % to about 8 wt %, about 1 wt % to about 7 wt %, about 1 wt % to about 6 wt %, about 1 wt % to about 5 wt %, about 1 wt % to about 4 wt %, about 1 wt % to about 3 wt %, about 5 wt % to about 20 wt %, about 5 wt % to about 18 wt %, about 5 wt % to about 15 wt %, about 5 wt % to about 13 wt %, about 5 wt % to about 12 wt %, about 5 wt % to about 11 wt %, about 5 wt % to about 10 wt %, about 5 wt % to about 8 wt %, about 5 wt % to about 7 wt %, about 5 wt % to about 6 wt %, about 8 wt % to about 20 wt %, about 8 wt % to about 18 wt %, about 8 wt % to about 15 wt %, about 8 wt % to about 13 wt %, about 8 wt % to about 12 wt %, about 8 wt % to about 11 wt %, about 8 wt % to about 10 wt %, or about 8 wt % to about 9 wt % of the nanoparticle dispersion solvent.

In other embodiments, the imprint composition contains about 50 wt %, about 55 wt %, about 60 wt %, about 62 wt %, about 65 wt %, about 68 wt %, or about 70 wt % to about 72 wt %, about 75 wt %, about 78 wt %, about 80 wt %, about 82 wt %, about 83 wt %, about 85 wt %, about 87 wt %, about 88 wt %, about 90 wt %, or about 95 wt % of the imprinting solvent. For example, the imprint composition contains about 50 wt % to about 95 wt %, about 60 wt % to about 95 wt %, about 60 wt % to about 90 wt %, about 60 wt % to about 88 wt %, about 60 wt % to about 85 wt %, about 60 wt % to about 83 wt %, about 60 wt % to about 80 wt %, about 60 wt % to about 78 wt %, about 60 wt % to about 75 wt %, about 60 wt % to about 72 wt %, about 60 wt % to about 70 wt %, about 60 wt % to about 68 wt %, about 60 wt % to about 65 wt %, about 60 wt % to about 63 wt %, about 70 wt % to about 98 wt %, about 70 wt % to about 95 wt %, about 70 wt % to about 90 wt %, about 70 wt % to about 88 wt %, about 70 wt % to about 85 wt %, about 70 wt % to about 83 wt %, about 70 wt % to about 80 wt %, about 70 wt % to about 78 wt %, about 70 wt % to about 75 wt %, about 70 wt % to about 72 wt %, about 75 wt % to about 98 wt %, about 75 wt % to about 95 wt %, about 75 wt % to about 90 wt %, about 75 wt % to about 88 wt %, about 75 wt % to about 85 wt %, about 75 wt % to about 83 wt %, about 75 wt % to about 80 wt %, or about 75 wt % to about 78 wt % of the imprinting solvent.

The additive can be or include one or more perfluoroalkyl ethers, one or more polyglycols, one or more fatty acids, one or more silanes, one or more siloxanes, or any combination thereof. Exemplary additives can be or include fluorosurfactant, fluoro-additive, and/or fluorocarbon (e.g., CAPSTONE® FS-66 or FS-68 fluorosurfactant, available from DuPont), glycolic acid ethoxylate oleyl ether, polyethylene glycol, polypropylene glycol, lauric acid, myristic acid, stearic acid, palmitic acid, dimethyldiethoxysilane, polydimethylsiloxane, polydiphenylsiloxane, hexamethylcyclotrisiloxane, octamethylcyclotetrasiloxane, silanol terminated polydimethylsiloxane, vinyl terminated polydimethylsiloxane, 1,2-propanediol, salts thereof, esters thereof, complexes thereof, or any combination thereof. The additive can be or include one or more diols, one or more alcohols with three or more alcohol groups, or any combination thereof. In one or more examples, the additive contains 1,2-propanediol. In some examples, the additive is at a concentration of about 0.01 wt % to about 2.5 wt %, based on the weight of the nanoparticles.

The imprint composition contains about 0.01 wt %, about 0.05 wt %, about 0.1 wt %, about 0.2 wt %, about 0.3 wt %, about 0.5 wt %, about 0.8 wt %, or about 1 wt % to about 1.2 wt %, about 1.5 wt %, about 1.8 wt %, about 2 wt %, about 2.5 wt %, about 3 wt %, about 3.5 wt %, about 4 wt %, about 5 wt %, about 6 wt %, about 8 wt %, or about 10 wt % of the additive. For example, the imprint composition contains about 0.01 wt % to about 10 wt %, about 0.01 wt % to about 8 wt %, about 0.01 wt % to about 5 wt %, about 0.01 wt % to about 4 wt %, about 0.01 wt % to about 3 wt %, about 0.01 wt % to about 2 wt %, about 0.01 wt % to about 1 wt %, about 0.01 wt % to about 0.5 wt %, about 0.01 wt % to about 0.1 wt %, about 0.01 wt % to about 0.05 wt %, about 0.1 wt % to about 10 wt %, about 0.1 wt % to about 8 wt %, about 0.1 wt % to about 5 wt %, about 0.1 wt % to about 4 wt %, about 0.1 wt % to about 3 wt %, about 0.1 wt % to about 2 wt %, about 0.1 wt % to about 1 wt %, about 0.1 wt % to about 0.5 wt %, about 1 wt % to about 10 wt %, about 1 wt % to about 8 wt %, about 1 wt % to about 5 wt %, about 1 wt % to about 4 wt %, about 1 wt % to about 3 wt %, about 1 wt % to about 2 wt %, or about 1 wt % to about 1.5 wt % of the additive.

The acrylate can be or include one or more methacrylates, one or more ethylacrylates, one or more propylacrylates, one or more butylacrylates, one or more mono-functional acrylates, one or more di-functional acrylates, one or more tri-functional acrylates, other multi-functional acrylates, or any combination thereof. Exemplary acrylates can be or include 3-(trimethoxysilyl)propyl methacrylate (3-MPS), 3-(trimethoxysilyl)propyl acrylate, di(ethylene glycol) methyl ether methacrylate, ethylene glycol methyl ether methacrylate, 2-ethylhexyl methacrylate, ethyl methacrylate, hexyl methacrylate, methacrylic acid, vinyl methacrylate, monomers thereof, polymers thereof, salts thereof, complexes thereof, or any combination. In some examples, the acrylate is at a concentration of about 0.05 wt % to about 10 wt %, based on the weight of the nanoparticles.

The imprint composition contains about 0.1 wt %, about 0.2 wt %, about 0.3 wt %, about 0.5 wt %, about 0.8 wt %, about 1 wt % to about 1.2 wt %, about 1.5 wt %, about 1.8 wt %, or about 2 wt %, about 2.2 wt %, about 2.3 wt %, about 2.5 wt %, about 2.8 wt %, about 3 wt %, about 3.2 wt %, about 3.5 wt %, about 3.8 wt %, about 4 wt %, about 5 wt %, about 6 wt %, about 8 wt %, about 10 wt %, about 12 wt %, about 15 wt %, about 18 wt %, or about 20 wt % of the acrylate. For example, the imprint composition contains about 0.1 wt % to about 20 wt %, about 0.1 wt % to about 15 wt %, about 0.1 wt % to about 10 wt %, about 0.1 wt % to about 8 wt %, about 0.1 wt % to about 5 wt %, about 0.1 wt % to about 4 wt %, about 0.1 wt % to about 3 wt %, about 0.1 wt % to about 2 wt %, about 0.1 wt % to about 1 wt %, about 0.1 wt % to about 0.5 wt %, about 1 wt % to about 20 wt %, about 1 wt % to about 15 wt %, about 1 wt % to about 10 wt %, about 1 wt % to about 8 wt %, about 1 wt % to about 5 wt %, about 1 wt % to about 4 wt %, about 1 wt % to about 3.5 wt %, about 1 wt % to about 3.2 wt %, about 1 wt % to about 3 wt %, about 1 wt % to about 2.8 wt %, about 1 wt % to about 2.5 wt %, about 1 wt % to about 2.3 wt %, about 1 wt % to about 2.2 wt %, about 1 wt % to about 2 wt %, about 1 wt % to about 1.8 wt %, about 1 wt % to about 1.5 wt %, about 1.8 wt % to about 20 wt %, about 1.8 wt % to about 15 wt %, about 1.8 wt % to about 10 wt %, about 1.8 wt % to about 8 wt %, about 1.8 wt % to about 5 wt %, about 1.8 wt % to about 4 wt %, about 1.8 wt % to about 3.5 wt %, about 1.8 wt % to about 3.2 wt %, about 1.8 wt % to about 3 wt %, about 1.8 wt % to about 2.8 wt %, about 1.8 wt % to about 2.5 wt %, about 1.8 wt % to about 2.3 wt %, about 1.8 wt % to about 2.2 wt %, or about 1.8 wt % to about 2 wt % of the acrylate.

In one or more examples, the imprint composition contains about 0.5 wt % to about 40 wt % of the nanoparticles, about 50 wt % to about 90 wt % of one or more solvents, about 5 wt % to about 40 wt % of the surface ligand, about 0.01 wt % to about 5 wt % of the additive, and about 0.1 wt % to about 10 wt % of the acrylate. In other examples, the imprint composition contains about 1 wt % to about 25 wt % of the nanoparticles, about 60 wt % to about 85 wt % of one or more solvents, about 6 wt % to about 35 wt % of the surface ligand, about 0.05 wt % to about 3 wt % of the additive, and about 0.3 wt % to about 8 wt % of the acrylate. In some examples, the imprint composition contains about 5 wt % to about 20 wt % of the nanoparticles, about 65 wt % to about 80 wt % of one or more solvents, about 7 wt % to about 31 wt % of the surface ligand, about 0.09 wt % to about 1.5 wt % of the additive, and about 0.5 wt % to about 6 wt % of the acrylate.

The imprint composition can have a viscosity of about 1 cP, about 2 cP, about 3 cP, about 5 cP, about 8 cP, or about 10 cP to about 12 cP, about 15 cP, about 20 cP, about 25 cP, about 30 cP, about 40 cP, about 50 cP, or about 70 cP. For example, the imprint composition can have a viscosity of about 1 cP to about 70 cP, about 1 cP to about 50 cP, about 1 cP to about 40 cP, about 1 cP to about 30 cP, about 1 cP to about 20 cP, about 1 cP to about 10 cP, about 1 cP to about 5 cP, about 10 cP to about 70 cP, about 10 cP to about 50 cP, about 10 cP to about 40 cP, about 10 cP to about 30 cP, about 10 cP to about 20 cP, about 20 cP to about 70 cP, about 20 cP to about 50 cP, about 20 cP to about 40 cP, about 20 cP to about 30 cP, or about 20 cP to about 25 cP.

In one or more embodiments, the one or more acrylates in the imprint composition can be polymerized and/or oligomerized while producing (e.g., curing or otherwise converting) the imprint material, such as the porous nanoimprint film.

Below are several prophetic examples of imprint compositions which can be produced by embodiments described and discussed herein.

| Generic Formulations | |
|---|---|
| Component | Concentration (wt %) |
| NPs | 0.5%-25% |
| surface ligand | 0.5%-20% |
| dispersion solvent | 5%-20% |
| acrylate | 0.5%-10% |
| imprinting solvent | 60%-80% |
| diol additive | 0.5%-8% |
| surfactant additive | 0.01%-1% |
| Total | 100 |

| Prophetic Example 1 | | |
|---|---|---|
| Component | Concentration (wt %) | Amount (g) |
| NPs (TiO$_2$) | 10% | 10 |
| surface ligand | 2% | 2 |
| PGMEA | 12% | 12 |
| 3-MPS | 2.3% | 2.3 |
| ethyl lactate | 71% | 71 |
| 1,2-propanediol | 3% | 3 |
| surfactant (FS66) | 0.15% | 0.15 |
| Total | 100 | 100 |

| Prophetic Example 2 | | |
|---|---|---|
| Component | Concentration (wt %) | Amount (g) |
| NPs (TiO$_2$) | 6.5% | 6.5 |
| surface ligand | 1.5% | 1.5 |
| PGMEA | 8% | 8 |
| 3-MPS | 2.3% | 2.3 |
| ethyl lactate | 79% | 79 |
| 1,2-propanediol | 2.55% | 2.55 |
| surfactant (FS66) | 0.15% | 0.15 |
| Total | 100 | 100 |

Figure 3:
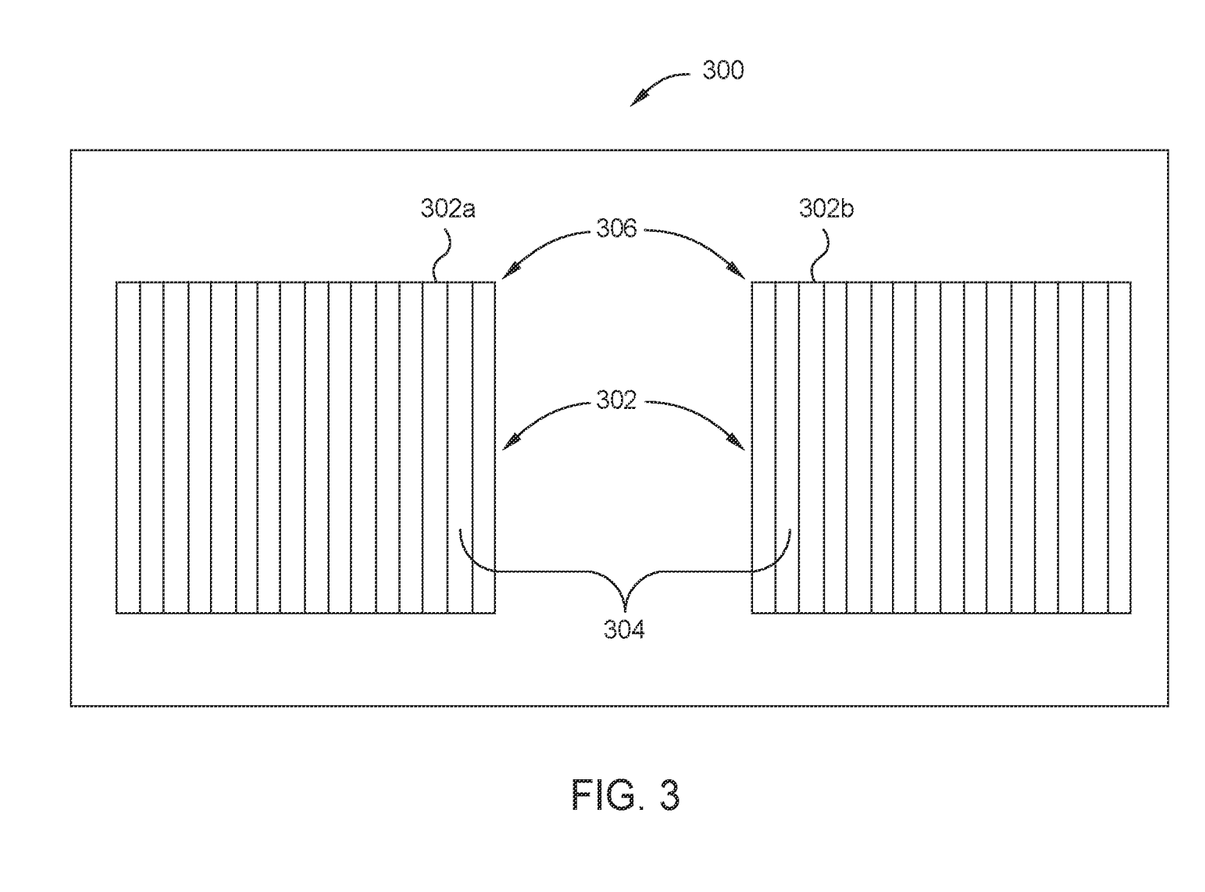
FIG. 3 depicts a front view of an optical device, according to one or more embodiments described and discussed herein.

FIG. 3 depicts a front view of an optical device 300 containing an optically densified nanoimprint film 306, as depicted in FIG. 2B, according to one or more embodiments described and discussed herein. In any embodiment described herein, the optically densified nanoimprint film 116, as depicted in FIG. 2B, can be the same or used as the optically densified nanoimprint film 306, as depicted in FIG. 3. It is to be understood that the optical device 300 described below is an exemplary optical device. In one or more embodiments, the optical device 300 is a waveguide combiner, such as an augmented reality waveguide combiner. In other embodiments, the optical device 300 is a flat optical device, such as a metasurface. The optical device 300 includes a plurality of device structures 304. The device structures 304 may be nanostructures having sub-micro dimensions, e.g., nano-sized dimensions, such as critical dimensions less than 1 μm. In one or more embodiments, regions of the device structures 304 correspond to one or more gratings 302, such as the grating areas 302a and 302b. In one or more embodiments, the optical device 300 includes a first grating area 302a and a second grating area 302b and each of the first grating area 302a and 302b each contain a plurality of device structures 304.

The depth of the gratings 302 may vary across the grating areas 302a and 302b in embodiments described herein. In some embodiments, the depth of the gratings 302 may vary smoothly over the first grating area 302a and over the second grating area 302b. In one or more examples, the depth may range from about 10 nm to about 400 nm across one of the grating areas. The grating area 302a, in some examples, can range from approximately 20 mm to approximately 50 mm on a given side. Therefore, as some examples, the angle of the change in the depth of the gratings 302 may be on the order of 0.0005 degrees.

In embodiments described herein, the device structures 304 may be created using laser ablation. Laser ablation, as used herein, is used to produce three-dimensional microstructures in the device material, or optionally to create a variable-depth structure in a sacrificial layer overlaying the device material as part of a variable-depth structure process. Using laser ablation to create the optical structures 304 allows for fewer processing operations and higher variable-depth resolution than existing methods.

Embodiments of the present disclosure further relate to any one or more of the following paragraphs 1-68:

1. A method of forming a nanoimprint film, comprising: positioning a substrate comprising a porous nanoimprint film within a processing chamber, wherein the porous nanoimprint film comprises nanoparticles and voids between the nanoparticles, and wherein the porous nanoimprint film has a refractive index of less than 2; and depositing a metal oxide on the porous nanoimprint film and within at least a portion of the voids to produce an optically densified nanoimprint film during an atomic layer deposition (ALD) process.

2. The method according to paragraph 1, wherein the metal oxide has a refractive index greater than the refractive index of the porous nanoimprint film.

3. The method according to paragraph 1 or 2, wherein the metal oxide has a refractive index less than the refractive index of the porous nanoimprint film.

4. The method according to any one of paragraphs 1-3, wherein the optically densified nanoimprint film has a refractive index greater than the refractive index of the porous nanoimprint film.

5. The method according to paragraph 4, wherein the refractive index of the optically densified nanoimprint film is about 0.5% to about 30% greater than the refractive index of the porous nanoimprint film.

6. The method according to paragraph 5, wherein the refractive index of the optically densified nanoimprint film is about 0.75% to about 10% greater than the refractive index of the porous nanoimprint film.

7. The method according to paragraph 6, wherein the refractive index of the optically densified nanoimprint film is about 1% to about 6% greater than the refractive index of the porous nanoimprint film.

8. The method according to any one of paragraphs 1-7, wherein the refractive index of the porous nanoimprint film is about 1.5 to about 1.95.

9. The method according to any one of paragraphs 1-8, wherein the refractive index of the optically densified nanoimprint film is about 1.8 or greater.

10. The method according to any one of paragraphs 1-9, wherein the metal oxide comprises aluminum oxide, titanium oxide, zirconium oxide, niobium oxide, tantalum oxide, indium oxide, indium tin oxide, hafnium oxide, chromium oxide, scandium oxide, tin oxide, zinc oxide, yttrium oxide, praseodymium oxide, magnesium oxide, silicon oxide, silicon nitride, silicon oxynitride, or any combination thereof.

11. The method according to any one of paragraphs 1-10, wherein the nanoparticles comprise titanium oxide, zirconium oxide, niobium oxide, tantalum oxide, hafnium oxide, chromium oxide, indium tin oxide, silicon nitride, or any combination thereof.

12. The method according to any one of paragraphs 1-11, wherein the ALD process comprises sequentially exposing the porous nanoimprint film to a metal precursor and an oxidizing agent during an ALD cycle to deposit the metal oxide.

13. The method according to paragraph 12, wherein the ALD cycle is repeated from 1 time to about 50 times while depositing the metal oxide during the ALD process.

14. The method according to any one of paragraphs 1-13, wherein at least 3% of the volume occupied by the voids is filled with the metal oxide by the ALD process.

15. The method according to any one of paragraphs 1-14, wherein about 20% to about 90% of the volume occupied by the voids is filled with the metal oxide by the ALD process.

16. A method according to any one of paragraphs 1-15, wherein the porous nanoimprint film is formed on the substrate by an imprint process, comprising: disposing an imprint composition comprising the nanoparticles on the substrate; contacting the imprint composition with a stamp having a pattern; converting the imprint composition to a porous nanoimprint film; and removing the stamp from the porous nanoimprint film.

17. The method according to paragraph 16, wherein the imprint composition is converted to the porous nanoimprint film by exposing the imprint composition to heat, ultraviolet light, infrared light, visible light, microwave radiation, or any combination thereof.

18. The method according to paragraph 16, wherein converting the imprint composition to the porous nanoimprint film further comprises exposing the imprint composition to a light source having a wavelength of about 300 nm to about 365 nm.

19. The method according to paragraph 16, wherein converting the imprint composition to the porous nanoimprint film further comprises heating the imprint composition to a temperature of about 30° C. to about 100° C. for a time period of about 30 seconds to about 1 hour.

20. The method according to paragraph 16, wherein converting the imprint composition to the porous nanoimprint film further comprises heating the imprint composition to a temperature of about 50° C. to about 60° C. for a time period of about 1 minute to about 15 minutes.

21. The method according to paragraph 16, wherein the imprint composition is disposed on the substrate by spin coating, drop casting, or blade coating.

22. The method according to paragraph 16, wherein the imprint composition is disposed on the substrate as a layer having a thickness of about 50 nm to about 1,000 nm.

23. The method according to paragraph 16, wherein the imprint composition is disposed on the substrate as a layer having a thickness of about 100 nm to about 400 nm.

24. The method according to paragraph 16, wherein the pattern on the stamp is a 1-dimension pattern, a 2-dimension pattern, or a 3-dimension pattern.

25. A method of forming a nanoimprint film, comprising: disposing an imprint composition comprising nanoparticles on a substrate; contacting the imprint composition with a stamp having a pattern; converting the imprint composition to a porous nanoimprint film; removing the stamp from the porous nanoimprint film; positioning the substrate comprising the porous nanoimprint film within a processing chamber, wherein the porous nanoimprint film comprises nanoparticles and voids between the nanoparticles, and wherein the porous nanoimprint film has a refractive index of less than 2; and depositing a metal oxide on the porous nanoimprint film and within at least a portion of the voids to produce an optically densified nanoimprint film during an atomic layer deposition (ALD) process, wherein the optically densified nanoimprint film has a refractive index greater than the refractive index of the porous nanoimprint film.

26. An optically densified nanoimprint film, comprising: a base nanoimprint film comprising nanoparticles and voids between the nanoparticles, and wherein the base nanoimprint film has a refractive index of less than 2; and a metal oxide disposed on the base nanoimprint film and contained within at least a portion of the voids; wherein the optically densified nanoimprint film has a refractive index greater than the refractive index of the base nanoimprint film.

27. The optically densified nanoimprint film according to paragraph 26, wherein the refractive index of the optically densified nanoimprint film is about 0.5% to about 30% greater than the refractive index of the base nanoimprint film.

28. The optically densified nanoimprint film according to paragraph 27, wherein the refractive index of the optically densified nanoimprint film is about 0.75% to about 10% greater than the refractive index of the base nanoimprint film.

29. The optically densified nanoimprint film according to paragraph 28, wherein the refractive index of the optically densified nanoimprint film is about 1% to about 6% greater than the refractive index of the base nanoimprint film.

30. The optically densified nanoimprint film according to any one of paragraphs 26-29, wherein the refractive index of the base nanoimprint film is about 1.5 to about 1.95.

31. The optically densified nanoimprint film according to any one of paragraphs 26-30, wherein the refractive index of the optically densified nanoimprint film is about 1.8 to about 2.05.

32. The optically densified nanoimprint film according to any one of paragraphs 26-31, wherein the metal oxide comprises aluminum oxide, titanium oxide, zirconium oxide, niobium oxide, tantalum oxide, indium oxide, indium tin oxide, hafnium oxide, chromium oxide, scandium oxide, tin oxide, zinc oxide, yttrium oxide, praseodymium oxide, magnesium oxide, silicon oxide, silicon nitride, silicon oxynitride, or any combination thereof.

33. The optically densified nanoimprint film according to any one of paragraphs 26-32, wherein the nanoparticles comprise titanium oxide, zirconium oxide, niobium oxide, tantalum oxide, hafnium oxide, chromium oxide, indium tin oxide, silicon nitride, or any combination thereof.

34. The optically densified nanoimprint film according to any one of paragraphs 26-33, wherein at least 3% of the volume occupied by the voids in the base nanoimprint film contains the metal oxide.

35. The optically densified nanoimprint film according to any one of paragraphs 26-34, wherein about 20% to about 90% of the volume occupied by the voids in the base nanoimprint film contains the metal oxide.

36. An optical device with gratings, comprising: the optically densified nanoimprint film produced by the method according to any one of paragraphs 1-25.

37. An optical device with gratings, comprising: the optically densified nanoimprint film according to any one of paragraphs 26-35.

38. An optical device with gratings, comprising: an optically densified nanoimprint film, comprising: a base nanoimprint film comprising nanoparticles and voids between the nanoparticles, and wherein the base nanoimprint film has a refractive index of less than 2; and a metal oxide disposed on the base nanoimprint film and contained within at least a portion of the voids; wherein the optically densified nanoimprint film has a refractive index greater than the refractive index of the base nanoimprint film.

39. A densified nanoimprint film, comprising: a base nanoimprint film comprising nanoparticles, wherein the nanoparticles comprise titanium oxide, zirconium oxide, niobium oxide, tantalum oxide, hafnium oxide, chromium oxide, indium tin oxide, silicon nitride, or any combination thereof; and a metal oxide disposed on the base nanoimprint film and in between the nanoparticles, wherein the metal oxide comprises aluminum oxide, titanium oxide, zirconium oxide, niobium oxide, tantalum oxide, indium oxide, indium tin oxide, hafnium oxide, chromium oxide, scandium oxide, tin oxide, zinc oxide, yttrium oxide, praseodymium oxide, magnesium oxide, silicon oxide, silicon nitride, silicon oxynitride, or any combination thereof.

40. The densified nanoimprint film according to paragraph 39, wherein the base nanoimprint film comprises voids disposed between the nanoparticles, and wherein the metal oxide is disposed at least partially within the voids.

41. The densified nanoimprint film according to paragraph 40, wherein at least 3% of the volume occupied by the voids in the base nanoimprint film contains the metal oxide.

42. The densified nanoimprint film according to paragraph 41, wherein about 20% to about 90% of the volume occupied by the voids in the base nanoimprint film contains the metal oxide.

43. The densified nanoimprint film according to any one of paragraphs 39-42, wherein the nanoparticles comprise titanium oxide.

44. The densified nanoimprint film according to paragraph 43, wherein the metal oxide comprises aluminum oxide.

45. The densified nanoimprint film according to any one of paragraphs 39-44, wherein the base nanoimprint film is a film by an imprint process comprising a spin-coating process, and wherein the metal oxide is a coating deposited by an atomic layer deposition process.

46. The densified nanoimprint film according to any one of paragraphs 39-45, wherein the densified nanoimprint film has a greater value of hardness, fracture strain, yield strength, and/or etch resistance than the base nanoimprint film.

47. The densified nanoimprint film according to any one of paragraphs 39-46, wherein the densified nanoimprint film has a lesser value of modulus of elasticity than the base nanoimprint film.

48. The densified nanoimprint film according to any one of paragraphs 39-47, wherein the refractive index of the densified nanoimprint film is about 0.5% to about 30% greater than the refractive index of the base nanoimprint film.

49. A method of forming a nanoimprint film, comprising: positioning a substrate comprising a porous nanoimprint film within a processing chamber, wherein the porous nanoimprint film comprises nanoparticles and voids between the nanoparticles, and wherein the nanoparticles comprise titanium oxide, zirconium oxide, niobium oxide, tantalum oxide, hafnium oxide, chromium oxide, indium tin oxide, silicon nitride, or any combination thereof; and depositing a metal oxide on the porous nanoimprint film and within at least a portion of the voids to produce an densified nanoimprint film during an atomic layer deposition (ALD) process, wherein the metal oxide comprises aluminum oxide, titanium oxide, zirconium oxide, niobium oxide, tantalum oxide, indium oxide, indium tin oxide, hafnium oxide, chromium oxide, scandium oxide, tin oxide, zinc oxide, yttrium oxide, praseodymium oxide, magnesium oxide, silicon oxide, silicon nitride, silicon oxynitride, or any combination thereof.

50. The method according to paragraph 49, wherein the ALD process comprises sequentially exposing the porous nanoimprint film to a metal precursor and an oxidizing agent during an ALD cycle to deposit the metal oxide.

51. The method according to paragraph 50, wherein the ALD cycle is repeated from 2 times to about 50 times while depositing the metal oxide during the ALD process.

52. The method according to any one of paragraphs 49-51, wherein at least 3% of the volume occupied by the voids is filled with the metal oxide by the ALD process.

53. The method according to any one of paragraphs 49-52, wherein about 20% to about 90% of the volume occupied by the voids is filled with the metal oxide by the ALD process.

54. The method according to any one of paragraphs 49-53, wherein the densified nanoimprint film has a greater value of hardness, fracture strain, yield strength, and/or etch resistance than the base nanoimprint film.

55. The method according to any one of paragraphs 49-54, wherein the densified nanoimprint film has a lesser value of modulus of elasticity than the base nanoimprint film.

56. The method according to any one of paragraphs 49-55, wherein the refractive index of the densified nanoimprint film is about 0.5% to about 30% greater than the refractive index of the base nanoimprint film.

57. A method according to any one of paragraphs 49-56, wherein the porous nanoimprint film is formed on the substrate by an imprint process, comprising: disposing an imprint composition comprising the nanoparticles on the substrate; contacting the imprint composition with a stamp having a pattern; converting the imprint composition to a porous nanoimprint film; and removing the stamp from the porous nanoimprint film.

58. The method according to paragraph 57, wherein the imprint composition is converted to the porous nanoimprint film by exposing the imprint composition to heat, ultraviolet light, infrared light, visible light, microwave radiation, or any combination thereof.

59. The method according to paragraph 57, wherein converting the imprint composition to the porous nanoimprint film further comprises exposing the imprint composition to a light source having a wavelength of about 300 nm to about 365 nm.

60. The method according to paragraph 57, wherein converting the imprint composition to the porous nanoimprint film further comprises heating the imprint composition to a temperature of about 30° C. to about 100° C. for a time period of about 30 seconds to about 1 hour.

61. The method according to paragraph 57, wherein converting the imprint composition to the porous nanoimprint film further comprises heating the imprint composition to a temperature of about 50° C. to about 60° C. for a time period of about 1 minute to about 15 minutes.

62. The method according to paragraph 57, wherein the imprint composition is disposed on the substrate by spin coating, drop casting, or blade coating.

63. The method according to paragraph 57, wherein the imprint composition is disposed on the substrate as a layer having a thickness of about 50 nm to about 1,000 nm.

64. The method according to paragraph 57, wherein the imprint composition is disposed on the substrate as a layer having a thickness of about 100 nm to about 400 nm.

65. The method according to paragraph 57, wherein the pattern on the stamp is a 1-dimension pattern, a 2-dimension pattern, or a 3-dimension pattern.

66. An optical device with gratings, comprising: the densified nanoimprint film according to any one of paragraphs 39-48.

67. An optical device with gratings, comprising: the densified nanoimprint film produced by the method according to any one of paragraphs 49-65.

68. An optical device with gratings, comprising: a densified nanoimprint film, comprising: a base nanoimprint film comprising nanoparticles, wherein the nanoparticles comprise titanium oxide, zirconium oxide, niobium oxide, tantalum oxide, hafnium oxide, chromium oxide, indium tin oxide, silicon nitride, or any combination thereof; and a metal oxide disposed on the base nanoimprint film and in between the nanoparticles, wherein the metal oxide comprises aluminum oxide, titanium oxide, zirconium oxide, niobium oxide, tantalum oxide, indium oxide, indium tin oxide, hafnium oxide, chromium oxide, scandium oxide, tin oxide, zinc oxide, yttrium oxide, praseodymium oxide, magnesium oxide, silicon oxide, silicon nitride, silicon oxynitride, or any combination thereof.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise, whenever a composition, an element, or a group of elements is preceded with the transitional phrase "comprising", it is understood that the same composition or group of elements with transitional phrases "consisting essentially of", "consisting of", "selected from the group of consisting of", or "is" preceding the recitation of the composition, element, or elements and vice versa, are contemplated.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A densified nanoimprint film, comprising:
   a base nanoimprint film comprising nanoparticles, wherein the base nanoimprint film comprises voids disposed between the nanoparticles, and wherein the nanoparticles comprise zirconium oxide, niobium oxide, tantalum oxide, titanium oxide, hafnium oxide, chromium oxide, silicon nitride, or any combination thereof; and a metal oxide disposed on the base nanoimprint film and in between the nanoparticles, wherein:
the nanoparticles and the metal oxide contain different materials;
the refractive index of the densified nanoimprint film is about 2% to about 30% greater than the refractive index of the base nanoimprint film; and
about 20% to about 100% of the volume occupied by the voids in the base nanoimprint film contains the metal oxide.

2. The densified nanoimprint film of claim 1, wherein about 20% to about 90% of the volume occupied by the voids in the base nanoimprint film contains the metal oxide.

3. The densified nanoimprint film of claim 1, wherein the refractive index of the densified nanoimprint film is about 10% to about 30% greater than the refractive index of the base nanoimprint film.

4. The densified nanoimprint film of claim 1, wherein the nanoparticles comprise niobium oxide, tantalum oxide, titanium oxide, chromium oxide, silicon nitride, or any combination thereof.

5. The densified nanoimprint film of claim 1, wherein the metal oxide comprises niobium oxide, chromium oxide, scandium oxide, yttrium oxide, praseodymium oxide, magnesium oxide, titanium oxide, aluminum oxide, silicon nitride, silicon oxynitride, or any combination thereof.

6. The densified nanoimprint film of claim 1, wherein the nanoparticles comprise titanium oxide, and wherein the metal oxide comprises aluminum oxide.

7. The densified nanoimprint film of claim 1, wherein the nanoparticles comprise titanium oxide, and wherein the metal oxide comprises niobium oxide, chromium oxide, scandium oxide, yttrium oxide, praseodymium oxide, magnesium oxide, silicon nitride, or any combination thereof.

8. The densified nanoimprint film of claim 1, wherein the base nanoimprint film is a film by an imprint process comprising a spin-coating process, and wherein the metal oxide is a coating deposited by an atomic layer deposition process.

9. The densified nanoimprint film of claim 1, wherein the densified nanoimprint film has a greater value of hardness, fracture strain, yield strength, and/or etch resistance than the base nanoimprint film.

10. The densified nanoimprint film of claim 1, wherein the densified nanoimprint film has a lesser value of modulus of elasticity than the base nanoimprint film.

11. A method of forming a nanoimprint film, comprising:
positioning a substrate comprising a porous nanoimprint film within a processing chamber, wherein the porous nanoimprint film comprises nanoparticles and voids between the nanoparticles, and wherein the nanoparticles comprise zirconium oxide, niobium oxide, tantalum oxide, titanium oxide, hafnium oxide, chromium oxide, silicon nitride, or any combination thereof; and
depositing a metal oxide on the porous nanoimprint film and within at least a portion of the voids to produce an densified nanoimprint film during an atomic layer deposition (ALD) process, wherein the metal oxide comprises niobium oxide, chromium oxide, titanium oxide, aluminum oxide, scandium oxide, yttrium oxide, praseodymium oxide, magnesium oxide, silicon nitride, silicon oxynitride, or any combination thereof, and wherein:
the nanoparticles and the metal oxide contain different materials;
the refractive index of the densified nanoimprint film is about 2% to about 30% greater than the refractive index of the porous nanoimprint film; and
about 20% to about 100% of the volume occupied by the voids in the porous nanoimprint film contains the metal oxide.

12. The method of claim 11, wherein the ALD process comprises sequentially exposing the porous nanoimprint film to a metal precursor and an oxidizing agent during an ALD cycle to deposit the metal oxide, and wherein the ALD cycle is repeated from 2 times to about 50 times while depositing the metal oxide during the ALD process.

13. The method of claim 11, wherein about 20% to about 90% of the volume occupied by the voids is filled with the metal oxide by the ALD process.

14. The method of claim 11, wherein the nanoparticles comprise titanium oxide, and wherein the metal oxide comprises aluminum oxide.

15. The method of claim 11, wherein the metal oxide comprises aluminum oxide or titanium oxide.

16. The method of claim 11, wherein the refractive index of the densified nanoimprint film is about 10% to about 30% greater than the refractive index of the porous nanoimprint film.

17. A method of claim 11, wherein the porous nanoimprint film is formed on the substrate by an imprint process, comprising:
disposing an imprint composition comprising the nanoparticles on the substrate;
contacting the imprint composition with a stamp having a pattern;
converting the imprint composition to a porous nanoimprint film; and
removing the stamp from the porous nanoimprint film.

18. The method of claim 17, wherein converting the imprint composition to the porous nanoimprint film further comprises exposing the imprint composition to a light source having a wavelength of about 300 nm to about 365 nm.

19. The method of claim 17, wherein converting the imprint composition to the porous nanoimprint film further comprises heating the imprint composition to a temperature of about 30° C. to about 100° C. for a time period of about 30 seconds to about 1 hour.

20. An optical device with gratings, comprising:
a densified nanoimprint film, comprising:
a base nanoimprint film comprising nanoparticles, wherein the nanoparticles comprise zirconium oxide, niobium oxide, tantalum oxide, titanium oxide, hafnium oxide, chromium oxide, silicon nitride, or any combination thereof; and
a metal oxide disposed on the base nanoimprint film and in between the nanoparticles, wherein the metal oxide comprises niobium oxide, chromium oxide, titanium oxide, aluminum oxide, scandium oxide, yttrium oxide, praseodymium oxide, magnesium oxide, silicon nitride, silicon oxynitride, or any combination thereof, and wherein:
the nanoparticles and the metal oxide contain different materials;
about 20% to about 100% of the volume occupied by the voids is filled with the metal oxide; and
a refractive index of the densified nanoimprint film is about 5% to about 30% greater than the refractive index of the base nanoimprint film.

* * * * *